United States Patent [19]
Meredith

[11] Patent Number: 5,742,584
[45] Date of Patent: Apr. 21, 1998

[54] POWER SHARING SYSTEM FOR RF AMPLIFIERS

[75] Inventor: Sheldon Kent Meredith, Phoenix, Ariz.

[73] Assignee: Radio Frequency Systems, Inc., Marlboro, N.J.

[21] Appl. No.: 873,634

[22] Filed: Jun. 12, 1997

Related U.S. Application Data

[63] Continuation of Ser. No. 504,021, Jul. 19, 1995, abandoned, which is a continuation-in-part of Ser. No. 314,898, Sep. 29, 1994, abandoned.

[51] Int. Cl.⁶ .................................................. H04B 7/00
[52] U.S. Cl. ........................... 370/210; 370/339; 455/137; 455/273; 455/517
[58] Field of Search ...................... 370/311, 315, 370/318, 328, 329, 332, 334, 339, 210, 272, 273, 293; 455/272, 273, 137, 517, 422, 436, 507, 575, 671, 673, 101, 38.3, 75; 330/124 R, 126

[56] References Cited

U.S. PATENT DOCUMENTS

| | | | |
|---|---|---|---|
| 3,710,281 | 1/1973 | Thomas | 333/6 |
| 3,731,217 | 5/1973 | Gerst et al. | 330/56 |
| 3,783,385 | 1/1974 | Dunn et al. | 325/305 |
| 3,964,065 | 6/1976 | Roberts et al. | 343/100 |
| 4,091,387 | 5/1978 | Profera | 343/754 |
| 4,163,974 | 8/1979 | Profera | 343/16 |
| 4,603,408 | 7/1986 | Singhal et al. | 367/92 |
| 4,647,868 | 3/1987 | Mueller | 330/286 |
| 4,774,481 | 9/1988 | Edwards et al. | 333/127 |
| 4,785,267 | 11/1988 | Covill | 333/127 |
| 4,814,730 | 3/1989 | Via et al. | 333/119 |
| 4,835,496 | 5/1989 | Schellenberg et a. | 333/128 |
| 4,932,049 | 6/1990 | Lee | 379/60 |
| 5,032,804 | 7/1991 | Hollingsworth | 333/132 |
| 5,070,304 | 12/1991 | Salib et al. | 330/54 |
| 5,091,875 | 2/1992 | Wong | 364/726 |
| 5,111,166 | 5/1992 | Plonka et al. | 333/128 |
| 5,162,804 | 11/1992 | Uyeda | 342/373 |
| 5,168,375 | 12/1992 | Reisch et al. | 358/432 |
| 5,187,447 | 2/1993 | Tsai | 330/124 |
| 5,193,109 | 3/1993 | Lee | 379/60 |
| 5,214,394 | 5/1993 | Wong | 330/286 |
| 5,222,246 | 6/1993 | Olkstein | 455/13.4 |
| 5,239,667 | 8/1993 | Kanai | 455/10 |
| 5,245,347 | 9/1993 | Bonta et al. | 342/149 |
| 5,302,914 | 4/1994 | Arntz et al. | 330/129 |
| 5,304,943 | 4/1994 | Koontz | 330/51 |
| 5,313,174 | 5/1994 | Edwards | 333/109 |
| 5,394,349 | 2/1995 | Eddy | 364/725 |

FOREIGN PATENT DOCUMENTS

| | | |
|---|---|---|
| 0593822 | 4/1994 | European Pat. Off. . |
| 9623329 | 8/1996 | WIPO . |

*Primary Examiner*—Alpus H. Hsu
*Assistant Examiner*—Kwang Bin Yao
*Attorney, Agent, or Firm*—Ware, Fressola, Van Der Sluys & Adolphson LLP

[57] ABSTRACT

A land mobile radio system (110) includes a plurality of receive antenna (120) for receiving RF signals transmitted from mobile units. Each receive antenna (120) is connected to a transform matrix (133) which divides each received RF signal into a number, N, of transformed signals, each transformed signal containing an equal power level part, 1/N, of each received RF signal. Each transformed signal is provided to an amplifier (135) for amplification thereof, and the amplified transformed signals are provided to an inverse-transform matrix (138) which recombines the equal parts of each amplified transformed signal into amplified received RF signals which are provided to an RF signal processing section (125). The amplified RF signals are thereafter provided to corresponding radio channel units (127).

20 Claims, 3 Drawing Sheets

POWER SHARING SYSTEM FOR RF AMPLIFIERS

This application is a continuation of application Ser. No. 08/504,021 filed on Jul. 19, 1995, now abandoned, which is a continuation-in-part of application Ser. No. 08/314,898 filed on Sep. 29, 1994, now abandoned.

TECHNICAL FIELD

The present invention relates to power sharing systems for radio frequency (RF) amplifiers.

BACKGROUND OF THE INVENTION

Land mobile radio systems must generate power at radio frequencies (RF) in order to communicate with remote mobile stations. Additionally, the land mobile radio system must be capable of receiving RF signals, via receive antennas, from the remote mobile stations.

The receive antennas used to receive RF signals from remote mobile stations are typically located in towers or on top of buildings such that the antennas are generally unobstructed for reliable receipt of RF signals. The signals transmitted from the remote mobile stations are generally very low power, and therefore the signal strength of the RF signals received by the receive antennas is very low. Therefore, the RF signals received by the receive antennas must be amplified prior to processing by receivers of the land mobile radio system.

Because of the very low power level of RF signals received by the receive antennas, it is desirable to amplify these signals as soon as possible after receipt and before transmission via cabling, e.g., coaxial cabling, to a receiver to thereby minimize signal interference and distortion. It is well known in the art to locate amplifiers for amplification of the received RF signals in a tower or at the top of a building as close as possible to the receive antennas. Using such a configuration, the received RF signals may be amplified before any interference or distortion is introduced during transmission via cabling. Alternatively, the receive amplifiers may be located in a more convenient location, such as at the base of an antenna tower. In this case, there is a loss of signal quality due to the losses during transmission.

In known land mobile radio systems, one receive amplifier is provided for each receive antenna. Typically, linear amplifiers are used for amplifying the received RF signals. Linear amplifiers are used because of the vary large dynamic range of the received RF signals. As is apparent to those skilled in the art, the signal strength of received RF signals from a remote mobile station that is close to the receive antennas will be much stronger than the received signal strength of received RF signals transmitted by more distant mobile stations. For example, the average signal strength of received RF signals may be approximately −40 dBm, and the for distant mobile stations, the received signal strength may be as low as −122 dBm. Therefore, it is important that the amplifiers used in the system have very linear amplification characteristics. If the amplifiers are not highly linear, additional undesired intermodulation signals will be present at the amplifiers output, thereby degrading communication quality.

It is well known to describe the linearity of an amplifier by its "output third order intercept point (IP3O)". For a given set of amplification conditions, the IP3O requirement for an amplifier is given by equation 1 below:

$$IP3O = 15 \log P_o - IM/2 + 5 \log (N^2 - 3N/2) \quad \text{(eq. 1)}$$

were: $P_o$=power output per radio channel in milliwatts; N=number of radio channels being amplified; and IM=maximum allowable intermodulation level (intermodulation distortion) in dBm.

In a typical land mobile radio system, there may be as many as 6 to 12 receive antennas for receiving radio signals from up to 60 channels. A problem exists in determining the size of a receive amplifier in such a land mobile radio system relates to the statistical determination of how many channels (users) will be received simultaneously by any one receive antenna. On average, there might only be 5 users, but it is very possible that as may as 20 users may demand service through a single amplifier at a particular instance in time. In this case, the linearity requirements of the amplifier increase by $5 \log(N^2-3N/2)$. For example, when increasing the number of users from 5 to 10, the IP3O intercept point increases by over 3 dBm as given by the examples below:

$$5 \log (5^2 - 3*5/2) = 6.22 \ dBm$$

$$5 \log (10^2 - 3*10/2) = 9.65 \ dBm$$

Therefore, the problem exists of selecting an appropriately sized amplifier to ensure that the amplification requirements for the worst case statistical peaking are met. If the amplifier is undersized, the signal quality of all received RF signals will suffer during amplification.

Another problem associated with such receive amplifiers is reliability. Since each receive antenna is associated with one amplifier, the antenna is rendered useless upon failure of the associated amplifier. This may result in an interruption of service in a sector (geographic area) associated with the beam of the corresponding antenna.

DISCLOSURE OF THE INVENTION

An object of the present invention is to provide an amplifier power sharing system for evenly distributing a plurality of input signals over the amplifiers of the system, and for thereafter recovering the amplified input signals.

Another object of the present invention is to provide a power sharing system which eliminates statistical peaking of the number of signals being amplified by any one amplifier.

A still further object of the present invention is to provide such a power sharing system wherein all of the input signal are amplified, even upon failure of one or more of the amplifiers in the power sharing system.

Another object of the present invention is to provide such a power sharing system for use in a land mobile radio system.

A further object of the present invention is to provide a land mobile radio system having reduced hardware cost, improved reliability and improved signal quality due to improved amplifier characteristics.

According to the present invention, a plurality of input signals are provided to a transform matrix which divides each input signal into a number, N, of transformed signals, each transformed signal containing an equal part, 1/N, of the power of each input signal; each transformed signal is provided to an amplifier for amplification thereof; and the amplified transformed signals are provided to an inverse-transform matrix which recombines the parts of each amplified transformed signal into amplified input signals.

In further accord with the present invention, the amplified input signals are amplified replicas of the input signals.

According further to the present invention, in a land mobile radio system having a plurality of receive antennas, the input signals are provided by the outputs of receive antennas, and the amplified input signals are thereafter provided to receivers.

In still further accord with the present invention, the transform matrix is a Fourier transform matrix and the inverse-transform matrix is an inverse-Fourier transform matrix.

According still further to the present invention, the land mobile radio system includes N antennas, and where N is a power of m, e.g., $N=m^r$, then the transform matrix is a Fourier transform matrix using a radix-m decimation-in-frequency algorithm having r stages, and the inverse-transform matrix in an inverse-Fourier transform matrix using a radix-m decimation-in-time algorithm having r stages.

The present invention provides a significant improvement over the prior art because a land mobile radio system may be provided having improved reliability of the amplification of received signals. All of the received signals are amplified, even upon failure of a receive amplifier. Using the system of the present invention, each amplifier is equally used by all receive antennas. Therefore, the problems associated with statistical peaking are eliminated.

The foregoing and other objects, features and advantages of the present invention will become more apparent in light of the following detailed description of exemplary embodiments thereof as illustrated in the accompanying drawings.

BEST MODE FOR CARRYING OUT THE INVENTION

The power sharing system of the present invention is particularly well suited for use in a land mobile radio system wherein the statistical peaking of the number of channels (users) received by any amplifier associated with a receive antenna of the system is eliminated because of the equal distribution of received RF signals (input signals) across each of the system amplifiers. Therefore, the required size of each system amplifier is minimized, but fully and uniformly utilized, thereby reducing hardware costs and improving reliability. Additionally, the system of the present invention provides improved reliability because, upon failure of any one amplifier, all of the received RF signals are amplified by the remaining amplifiers.

The present invention implements the principles of a power sharing system designed for use with RF signals provided by radio channel units and amplified in high power linear amplifiers, the system being described in commonly owned, copending U.S. patent application Ser. No. 08/314, 898 filed on Sep. 29, 1994, the disclosure of which is incorporated herein by reference.

Figure 1:
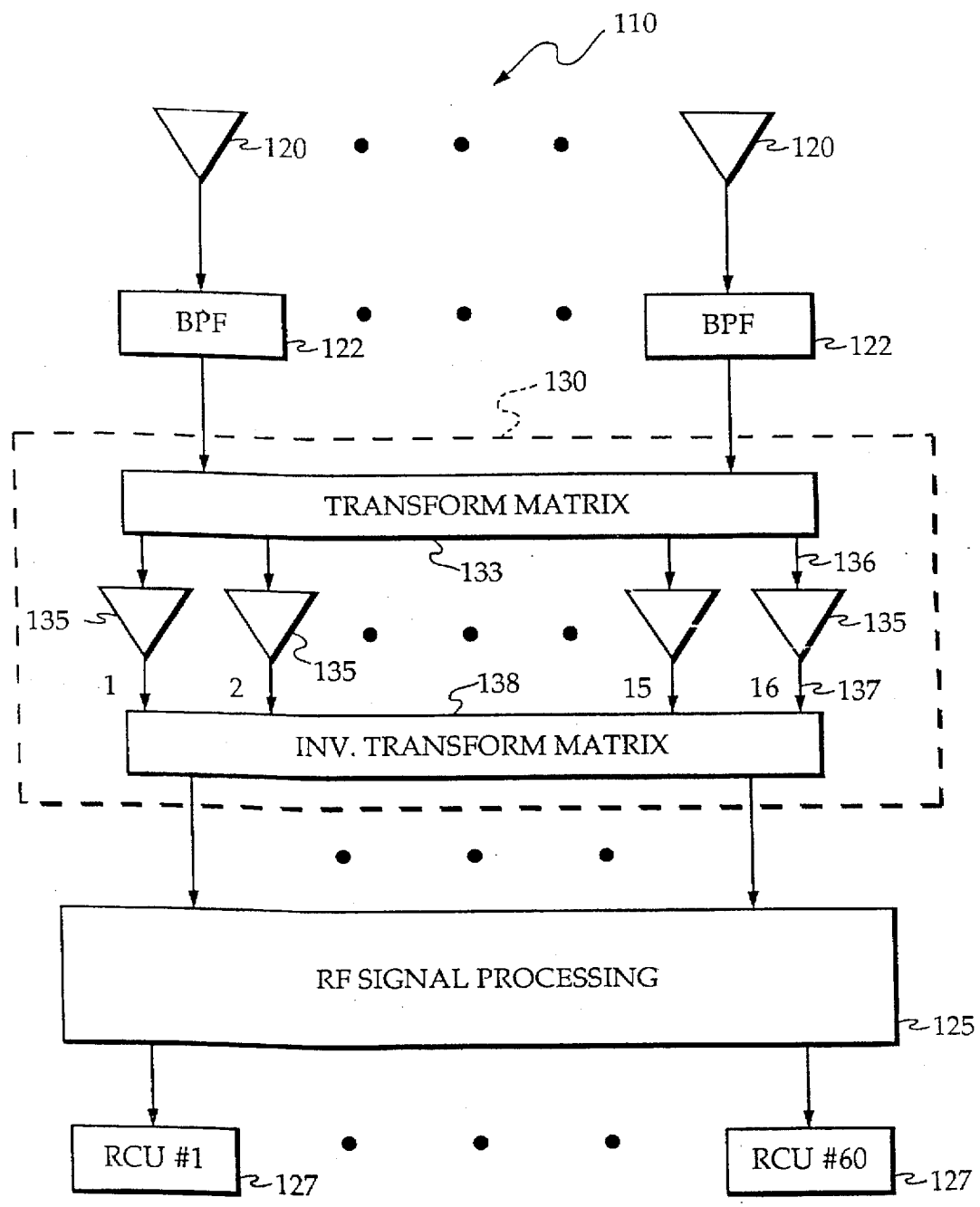
FIG. 1 is a schematic block diagram of a land mobile radio system having power sharing in accordance with the present invention.

Referring to FIG. 1, a land mobile radio system 110 includes a plurality of receive antenna 120 for receiving RF signals transmitted from mobile stations (not shown). The received RF signals are filtered in band pass filters (BPF) 122, and then provided to an RF signal processing section 125 via the power sharing system 130 of the present invention. The RF signal processing section 125 includes splitters, router, switching, signal processing and any other appropriate equipment for providing each received RF signal to an appropriate radio channel unit 127. Each radio channel unit 127 is a "channel". The system 110 may be used with a large number of channels, e.g., 60 channels.

The power sharing system 130 includes an N×N Fourier transform matrix (Fast-Fourier transform matrix) 133 which receives the outputs of the band pass filters 122, and provides transformed output signals to each of a plurality of linear power amplifiers 135. The outputs of the linear power amplifiers 135 are provided to an N×N inverse-Fourier transform matrix (inverse-Fast-Fourier transform matrix) 138. In the example of the present invention, there are sixteen (16) linear power amplifiers 135. Both the Fourier transform matrix 133 and the inverse-Fourier transform matrix 138 are 16×16 matrices. However, as will be understood by those skilled in the art, any number of linear power amplifiers 135 may be used, as described hereinafter. Using the 16×16 matrices described herein with respect to the invention, RF signals from up to 16 receive antennas 120 may be amplified using the power sharing system 130.

Figure 2:
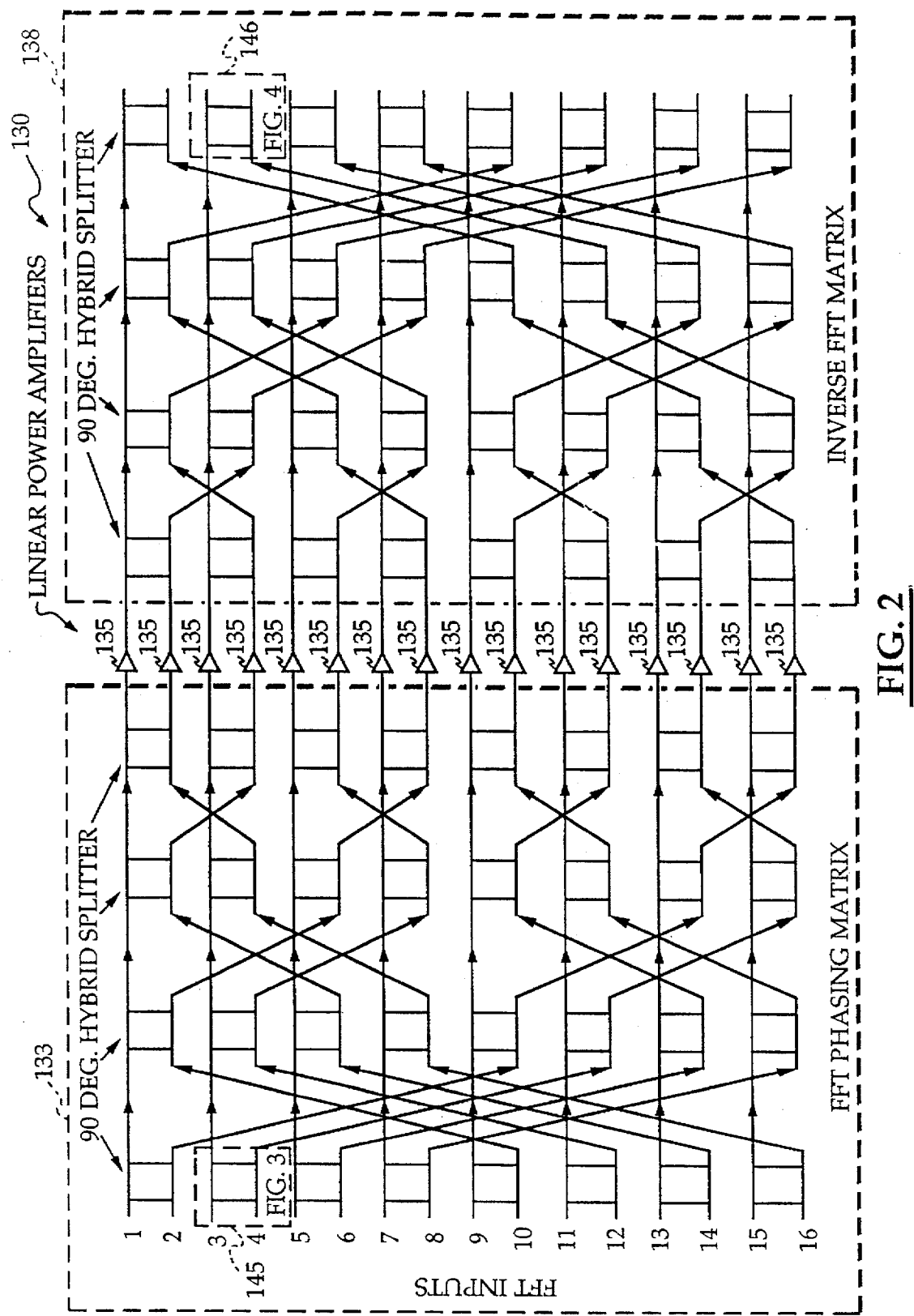
FIG. 2 is a diagram showing the operation of a Fourier transform matrix and an inverse-Fourier transform matrix in relation to 16 linear power amplifiers of the system of FIG. 1, the Fourier transform matrix using a radix-2 decimation-in-frequency algorithm having four stages and the inverse-Fourier transform matrix using a radix-2 decimation-in-time algorithm having four stages.

Referring also to FIG. 2, the power sharing system 130 is shown in greater detail. The Fourier transform matrix 133 evenly spreads the outputs of the band pass filters 122 over the 16 linear power amplifiers 135. This is accomplished by using a radix-2 decimation-infrequency algorithm having four stages. A radix-2 decimation-in-frequency algorithm is described in greater detail on pages 28 through 30 and FIGS. 8 through 14 of Kraniauskas, Peter, "A Plain Man's Guide to the FFT", IEEE Signal Processing Magazine, Pages 24–35, April 1994, the disclosure of which is incorporated herein by reference. As will be understood by those skilled in the art, each stage of a radix-2 decimation-in-frequency algorithm includes a plurality of ninety degree hybrid splitters 145, which are shown in greater detail in FIG. 3.

Figure 3:
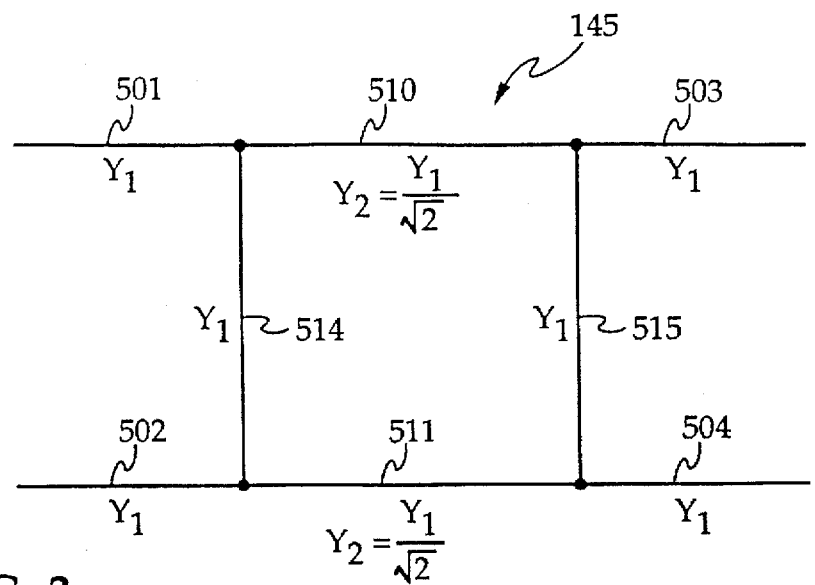
FIG. 3 is a diagram of a ninety degree hybrid splitter used in the Fourier transform matrix and inverse-Fourier transform matrix of FIG. 2.

Referring to FIG. 3, each ninety degree hybrid splitter 145 may be a symmetrical four-port branch line coupler of the type known in the art. In the first stage of the Fourier transform matrix, outputs from two of the 16 lossy combiners are coupled to the splitter by a pair of input ports (lines) 501,502 having an identical characteristic impedance, $Y_1$, e.g., 50Ω. The outputs from the splitter are provided on a pair of output ports (lines) 503,504. The output ports 503, 504 have the same characteristic impedance, $Y_1$, as the input ports 501,502. The input ports 501,502 are connected to the output ports 503,504 by a pair of primary lines 510,511. Additionally, the input ports 501,502 and the output ports 503,504 are shunt connected by a pair of secondary lines (branch lines) 514,515. The length and impedance of the primary lines 510,511 and secondary lines 514,515 is selected to provide the desired division ratio of the input signals to the output signals.

To implement the desired ninety degree hybrid splitter of the present invention, the characteristic impedance, $Y_2$, of the primary lines 510,511 is selected to be equal to the characteristic impedance of the input and output ports times $2^{-\frac{1}{2}}$, i.e., $Y_2=(Y_1)(2^{-\frac{1}{2}})=0.707Y_1$. The characteristic impedance of the secondary lines is the same as the characteristic impedance of the input and output ports, i.e., $Y_1$. The length of the primary lines and secondary lines is selected to be one-quarter (¼) wavelength of the input signals. The phase velocity of the signals in the primary lines and secondary lines will be different because of the different characteristic impedance of the lines, and therefore, lines of different lengths must be used to provide the one-quarter wavelength length.

Figure 4:
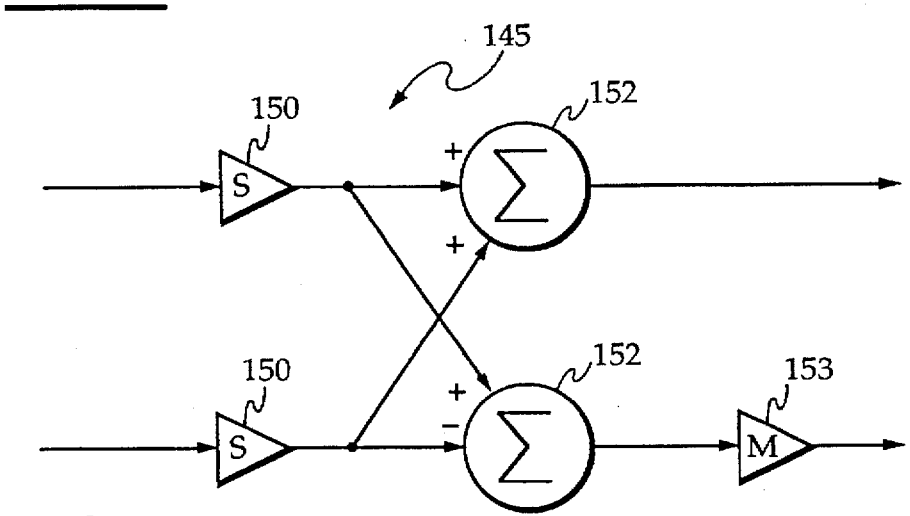
FIG. 4 is a diagram showing an alternative embodiment of a ninety degree hybrid splitter of the Fourier transform matrix of FIG. 2.

The hybrid splitter 145 may also be implemented using a "decimation-in-frequency butterfly" as illustrated in FIG. 4. Referring to FIG. 4, a decimation-in-frequency butterfly includes scaling functions 150, algebraic functions 152 and multipliers 153 known as "twiddle factors". The scaling factors 150 are not required at every decimation stage, and can be collected to be applied only once, either to the input sequence or the output sequence of the Fourier transform matrix 133. As is known in the art, each of the splitters 145 shifts its input by ½ of its period, in this case ninety degrees. The output of a decimation stage can be interpreted as two half-length sentences of the input of the stage. Therefore, by recursively applying the decimation process over four stages, each one of the 16 lossy combiner output signals is spread out evenly over the 16 matrix outputs, e.g., $2^4=16$, so that each amplifier amplifies one-sixteenth of each channel.

As shown in both FIGS. 1 and 2, the outputs of the Fourier transform matrix 133 are provided as the inputs to each power amplifier 135. In this case, using the Fourier transform matrix described hereinabove, each amplifier is used by all received RF signals at a low power per channel. Therefore, even if all channels are active simultaneously, the maximum power ever required by any one amplifier is just 1/N(1/16th) of the total power for all channels. In a system 110 having 60 channels, this gives an effective peak power requirement for each amplifier equal to that for less than 4 (60÷16=3.75) channels. Therefore, no statistical peaking allowance is required with the amplification system of the present invention. Additionally, in prior art systems, if one of the amplifiers fails, no received RF signals received from the corresponding receive antenna 120 are amplified. In contrast, using the power sharing system of the present invention, if one of the amplifiers fails, all of the RF signals are still amplified by the remaining operating amplifiers. Therefore, the maintenance problems associated with the amplifiers are greatly reduced. There is no need to urgently replace or repair a failed amplifier because all of the RF signals are amplified by the remaining amplifiers.

Figure 5:
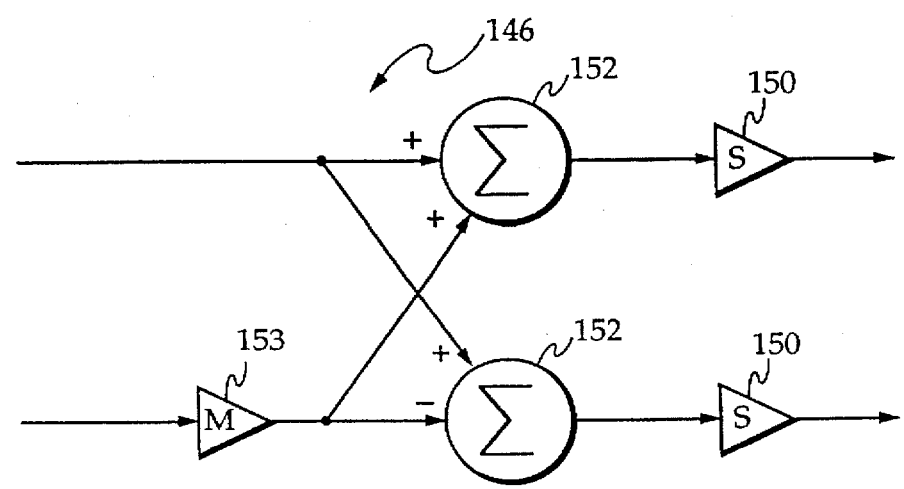
FIG. 5 is a diagram showing an alternative embodiment of a ninety degree hybrid splitter of the inverse-Fourier transform matrix of FIG. 2.

After amplification of the distributed received RF signals, the original received RF signals are reconstructed by the inverse-Fourier transform matrix 138. The inverse-Fourier transform matrix utilizes a radix-2 decimation-in-time algorithm having four stages to convert the outputs of the 16 amplifiers into amplified replicas of the received RF signals. The operation of the radix-2 decimation-in-time algorithm is described on pages 31 through 32 and FIGS. 15 through 19 of the above referenced Kraniauskas article, the disclosure of which is incorporate herein by reference. A ninety degree hybrid splitter 146, of the type shown in FIG. 3 and described hereinabove, is used in the radix-2 decimation-in-time algorithm. Alternatively, a "decimation-in-time butterfly" of the type shown in FIG. 5 may be used to implement the inverse-Fourier transform matrix. The decimation-in-time butterfly 146 is basically the inverse of the decimation-in-frequency butterfly 145 (FIG. 4). Each stage combines corresponding half-length sequences, starting with the final decimation stage, and back-propagates the arguments towards the input stage. As mentioned above, the final outputs are amplified replicas of the received RF signals. Thereafter, the outputs of the inverse-Fourier transform matrix are provided to the RF signal processing section 125 (FIG. 1).

As discussed herein above, each splitter 145 in the Fourier transform matrix introduces a ninety degree phase shift to the input of the splitter for producing two half-length sequences of the splitter input. Similarly, in the inverse-Fourier transform matrix, each splitter combines two half-length sequences into an original parent sequence. If, either during amplification of the outputs of the Fourier transform matrix or during transmission of the input and output of the amplifiers 135 on signal lines 136 and 137, different phase shifts are introduced into the signals, the signals may be improperly reconstructed in the inverse-Fourier transform matrix. Therefore, it is important that the signal lines 136, 137 and amplifiers 135 be phase-balanced with respect to one another so that each signal experiences an identical phase shift during amplification and transmission between the Fourier transform matrix and inverse-Fourier transform matrix. The phase-balancing may be accomplished by controlling the lengths of the signal lines 136, 137, and/or by adjusting the phase shift introduced by the amplifiers 135.

Although the preferred embodiment of the present invention is illustrated with a radix-2 Fast-Fourier Transform (FFT) having four stages, it will be understood by those skilled in the art that a variety of radices may be used in the Fourier transform matrix 133 (FIG. 1) and in the inverse-Fourier transform matrix 138 (FIG. 2) for implementing the present invention. For a given number of antennas and associated amplifiers, N, where N is a power of m, i.e., $N=m^r$, then the Fourier transform matrix uses a radix-m decimation-in-frequency algorithm having r stages and the inverse-Fourier transform matrix uses a radix-m decimation-in-time algorithm having r stages. In the example given above, N is 16 and m is 2, and therefore there are four stages, i.e., r=4. However, if a radix-4 decimation-in-frequency algorithm is used, only two stages are required. As will be understood by those skilled in the art, depending on the number of amplifiers used in the system, other radices and associated number of stages may be selected to meet the requirements of the implementation. Examples of radix-3 and radix-4 radices are provided on pages 32–35 of the above referenced *Kraniauskas* article, the disclosure of which is incorporated herein by reference.

The power sharing system is described herein as being used in a land mobile radio system. However, the principles of the present invention may be applied to any system where a number of signals are to be amplified by a plurality of amplifiers and presented at a given output (antenna or receiver for instance).

It will be understood by those skilled in the art that the terms "Fourier" and "Fast-Fourier" are used interchangeably throughout the above description. The operating principles of the present invention are equally applicable to a power sharing system using either type of transform matrix. It will be further understood by those skilled in the art the other types of matrix implementations may be used provided that the desired power sharing and phase shifting is accomplished. For example, it is expected that the present invention can be implemented using a Butler transform matrix.

Although the invention has been described and illustrated with respect to exemplary embodiments thereof, it should be understood by those skilled in the art that the foregoing and various other omissions and additions may be made therein and thereto without departing from the spirit and scope of the present invention.

What is claimed is:

1. A power sharing system for a land mobile radio system for amplifying a plurality of radio frequency signals each received from a mobile radio unit, comprising:

a plurality of receive antennas for receiving the radio frequency signals transmitted by the mobile radio units, each one of said radio frequency signals having a frequency associated with one of a plurality of channels of the land mobile radio system; and a radio frequency signal amplification means for amplifying each of said radio frequency signals, said radio frequency signal amplification means including:

(a) transform matrix means connected to said plurality of receive antennas and responsive to the radio frequency signals received by said plurality of receive antennas for providing transformed signals, each one of said transformed signals containing an equal power portion of each one of the radio frequency signals received by said plurality of receive antennas;

(b) a plurality of amplification means, each having a uniform gain, connected to said transform matrix means, each one of said amplification means receiving a corresponding one of said transformed signals for providing amplified transformed signals, a size of each one of said amplification means being determined based on the number of said channels associated with the land mobile radio system and independent of a statistical determination of the number of said channels being simultaneously received on any one of said receive antennas; and (c) inverse-transform matrix means responsive to said amplified transformed signals for providing amplified radio frequency signals, each one of said amplified radio frequency signals corresponding to one of the radio frequency signals received by said plurality of receive antennas;

whereby the radio frequency signals received by said plurality of receive antennas are equally distributed across said plurality of amplification means such that each one of said plurality of amplification means is uniformly utilized and a required size of each one of said plurality of amplification means is minimized, and whereby reliability of amplifying the plurality of radio frequency signals received by said plurality of receive antennas is improved because upon failure of any one of said plurality of amplification means, all of the radio frequency signals received by said plurality of receive antennas are equally amplified by said plurality of amplification means which have not failed.

2. A power sharing system according to claim 1 wherein said transform matrix means is a Fourier transform matrix and said inverse-transform matrix means is an inverse-Fourier transform matrix.

3. A power sharing system according to claim 2 wherein:

the power sharing system comprises a number, N, of said amplification means, where N is a power, r, of m as given by the relationship $$N = m^r$$

said Fourier transform matrix is implemented using a radix-m decimation-in-frequency algorithm having r stages, and said inverse-Fourier transform matrix is implemented using a radix-m decimation-in-time algorithm having r stages.

4. A power sharing system according to claim 2 wherein:

the power sharing system comprises a number, N, of said amplification means, where N is a power, r, of m as given by the relationship $$N = m^r$$

said Fast-Fourier transform matrix is implemented using a radix-m decimation-in-time algorithm having r stages, and said inverse-Fast-Fourier transform matrix is implemented using a radix-m decimation-in-time algorithm having r stages.

5. A power sharing system according to claim 4, further comprising a plurality of radio channel units connected to said inverse-transform matrix means, each radio channel unit receiving a corresponding one of said amplified radio frequency signals.

6. A power sharing system according to claim 5, wherein each one of said amplification means are phase balanced with respect to one another such that each one of said amplified transformed signals experiences an identical phase shift during amplification by said amplification means.

7. A power sharing system according to claim 1 wherein:

the power sharing system comprises a number, N, of said amplification means, where N is a power, r, of m as given by the relationship $$N = m^r$$

said transform matrix means is a Fourier transform matrix using a radix-m decimation-in-frequency algorithm having r stages, and said inverse-transform matrix means is an inverse-Fourier transform matrix using a radix-m decimation-in-time algorithm having r stages.

8. A power sharing system according to claim 7, further comprising a plurality of radio channel units connected to said inverse-transform matrix means, each radio channel unit receiving a corresponding one of said amplified radio frequency signals.

9. A power sharing system according to claim 8, wherein each one of said transformed signals contains a portion, 1/N, of each radio frequency signal.

10. A power sharing system according to claim 1, wherein each one of said amplification means are phase balanced with respect to one another such that each one of said amplified transformed signals experiences an identical phase shift during amplification by said amplification means.

11. A power sharing system according to claim 1 wherein said transform matrix means is a Fast-Fourier transform matrix and said inverse-transform matrix means is an inverse-Fast-Fourier transform matrix.

12. A method for amplifying a plurality of radio frequency signals each received from a mobile radio unit, the method comprising the steps of:

providing a plurality of receive antennas;

receiving the radio frequency signals transmitted by the mobile radio units on said plurality of receive antennas, each one of said radio frequency signals having a frequency associated with one of a plurality of channels of the land mobile radio system; and amplifying said radio frequency signal, including the steps of:

(a) transforming the radio frequency signals received by said plurality of receive antennas into transformed signals, each transformed signal containing an equal power portion of each one of the radio frequency signals received by said plurality of receive antennas;

(b) providing a plurality of amplification means each having a uniform gain for amplifying each one of the transformed signals for providing corresponding amplified transformed signals, wherein a size of each one of said amplification means is determined based on the number of said channels associated with the land mobile radio system and independent of a statistical determination of the number of said channels being simultaneously received on any one of said receive antennas; and (c) inverse-transforming said amplified transformed signals into a plurality of amplified radio frequency signals, each one of said amplified radio frequency signals corresponding to one of the radio frequency signals received by said plurality of receive antennas;

whereby the radio frequency signals received by said plurality of receive antennas are equally distributed across said plurality of amplification means such that each one of said plurality of amplification means is uniformly utilized and a required size of each one of said plurality of amplification means is minimized, and whereby reliability of amplifying the plurality of radio frequency signals received by said plurality of receive antennas is improved because upon failure of any one of said plurality of amplification means, all of the radio frequency signals received by said plurality of receive antennas are amplified by said plurality of amplification means which have not failed.

13. The method of claim 12 further comprising the step of providing each amplified radio frequency signal to a corresponding radio channel unit.

14. The method of claim 12, wherein said plurality of amplification means is a plurality of amplifiers, and further comprising the step of phase balancing said amplifiers with respect to one another such that each one of said amplified transformed signals experiences an identical phase shift during said step of amplifying.

15. The method of claim 12, wherein said plurality of amplification means is a plurality of amplifiers, and further comprising the steps of:

providing a number, N, of said plurality of amplifiers for amplifying said transformed signals, where N is a power, r, of m as given by the relationship:

$$N=m^r$$

said step of transforming is performed by a transform matrix means implemented using a radix-m decimation-in-frequency algorithm having r stages; and said step of inverse-transforming is performed by an inverse-transform matrix means implemented using a radix-m decimation-in-time algorithm having r stages.

16. The method of claim 15, wherein each one of said transformed signals contains a portion, 1/N, of each radio frequency signal.

17. A power sharing system for a land mobile radio system for amplifying a plurality of mobil radio signals, each mobil radio signal received from a respective mobile a plurality of receive antennas for receiving the mobil radio signals transmitted by the mobile radio units, each one of said mobil radio signals having a frequency associated with one of a plurality of channels of the land mobile radio system; and a radio frequency signal amplification means for amplifying each of said radio frequency signals, said radio frequency signal amplification means including:

(a) transform matrix means connected to said plurality of receive antennas and responsive to the mobil radio signals received by said plurality of receive antennas for providing transformed mobil radio signals, each one of said transformed mobil radio signals containing an equal power portion of each one of the mobil radio signals received by said plurality of receive antennas;

(b) a plurality of amplification means connected to said transform matrix means, each one of said amplification means receiving a corresponding one of said transformed mobil radio signals for providing amplified transformed mobil radio signals, a size of each one of said amplification means being determined based on the number of said channels associated with the land mobile radio system and independent of a statistical determination of the number of said channels being simultaneously received on any one of said receive antennas; and (c) inverse-transform matrix means responsive to said amplified transformed mobil radio signals for providing amplified mobil radio signals, each one of said amplified mobil radio signals corresponding to one of the mobil radio signals received by said plurality of receive antennas.

18. A power sharing system according to claim 17 wherein:

the power sharing system comprises a number, N, of said amplification means, where N is a power, r, of m as given by the relationship $$N=m^r$$

said transform matrix means is a Fourier transform matrix implemented using a radix-m decimation-in-frequency algorithm having r stages, and said inverse-transform matrix means is an inverse-Fourier transform matrix implemented using a radix-m decimation-in-time algorithm having r stages.

19. A power sharing system according to claim 17, further comprising a plurality of radio channel units connected to said inverse-transform matrix means, each radio channel unit receiving a corresponding one of said amplified mobil radio signals.

20. A power sharing system according to claim 17, wherein each one of said transformed mobil radio signals contains a portion, 1/N, of each mobil radio signal.

* * * * *

UNITED STATES PATENT AND TRADEMARK OFFICE
CERTIFICATE OF CORRECTION

PATENT NO. : 5,742,584
DATED : April 21, 1998
INVENTOR(S) : Sheldon Kent Meredith It is certified that error appears in the above-identified patent and that said Letters Patent is hereby corrected as shown below:

At column 8, line 12, change "decimation-in-time" to --decimation-in-frequency--.

At column 10, line 3, after "mobile" insert --radio unit, comprising:--.

Signed and Sealed this

Eleventh Day of August 1998

*Attest:*

*Attesting Officer*

BRUCE LEHMAN

*Commissioner of Patents and Trademarks*